(12) United States Patent
Hayasaki et al.

(10) Patent No.: US 6,448,620 B2
(45) Date of Patent: Sep. 10, 2002

(54) SEMICONDUCTOR DEVICE AND PROCESS FOR PRODUCING THE SAME

(75) Inventors: Yoshiki Hayasaki; Hitomichi Takano; Masahiko Suzumura; Yuji Suzuki; Yoshifumi Shirai; Takashi Kishida; Takeshi Yoshida; Takaaki Yoshihara, all of Kadoma (JP)

(73) Assignee: Matsushita Electric Works, Ltd., Kadoma (JP)

( * ) Notice: Subject to any disclaimer, the term of this patent is extended or adjusted under 35 U.S.C. 154(b) by 0 days.

(21) Appl. No.: 09/741,812

(22) Filed: Dec. 22, 2000

(30) Foreign Application Priority Data

Dec. 22, 1999 (JP) ............................. 11-364919

(51) Int. Cl.⁷ .................... H01L 27/01; H01L 27/13
(52) U.S. Cl. ................... 257/404; 257/348; 257/403
(58) Field of Search ...................... 257/347, 348, 257/403, 404

(56) References Cited

U.S. PATENT DOCUMENTS

| | | | |
|---|---|---|---|
| 5,300,448 A | 4/1994 | Merchant, et al. | 438/163 |
| 5,371,394 A * | 12/1994 | Ma et al. | 257/335 |
| 5,412,241 A | 5/1995 | Merchant | 257/409 |
| 5,907,173 A * | 5/1999 | Kwon et al. | 257/336 |
| 5,977,590 A * | 11/1999 | Suzuki | 257/339 |
| 6,025,237 A * | 2/2000 | Choi | 257/335 |
| 6,307,224 B1 * | 10/2001 | Shirai | 257/288 |

FOREIGN PATENT DOCUMENTS

JP          08181321 A  *  7/1996  ......... H01L/29/786

* cited by examiner

*Primary Examiner*—Allan R. Wilson
(74) *Attorney, Agent, or Firm*—Oblon, Spivak, McClelland, Maier & Neustadt, P.C.

(57) ABSTRACT

To provide a semiconductor device having a large allowable current, a demanded withstand voltage, and small output capacitance and resistance, the semiconductor device comprises a semiconductor layer formed on a semiconductor substrate, and the semiconductor layer includes a first conductivity type-drain region, a second conductivity type-well region apart from the drain region, a first conductivity type-source region in the well region apart from one end of the well region on the side of the drain region, a first conductivity type-drift region formed between one end of the well region and the drain region and in contact with the well region and the drain region, respectively, and a gate electrode formed spaced a gate oxide layer and on the well region located between the drift region and the source region; and the impurity concentration of the drift region decreases in the lateral direction and also in the vertical direction, respectively, as the distance from the drain region increases.

9 Claims, 9 Drawing Sheets

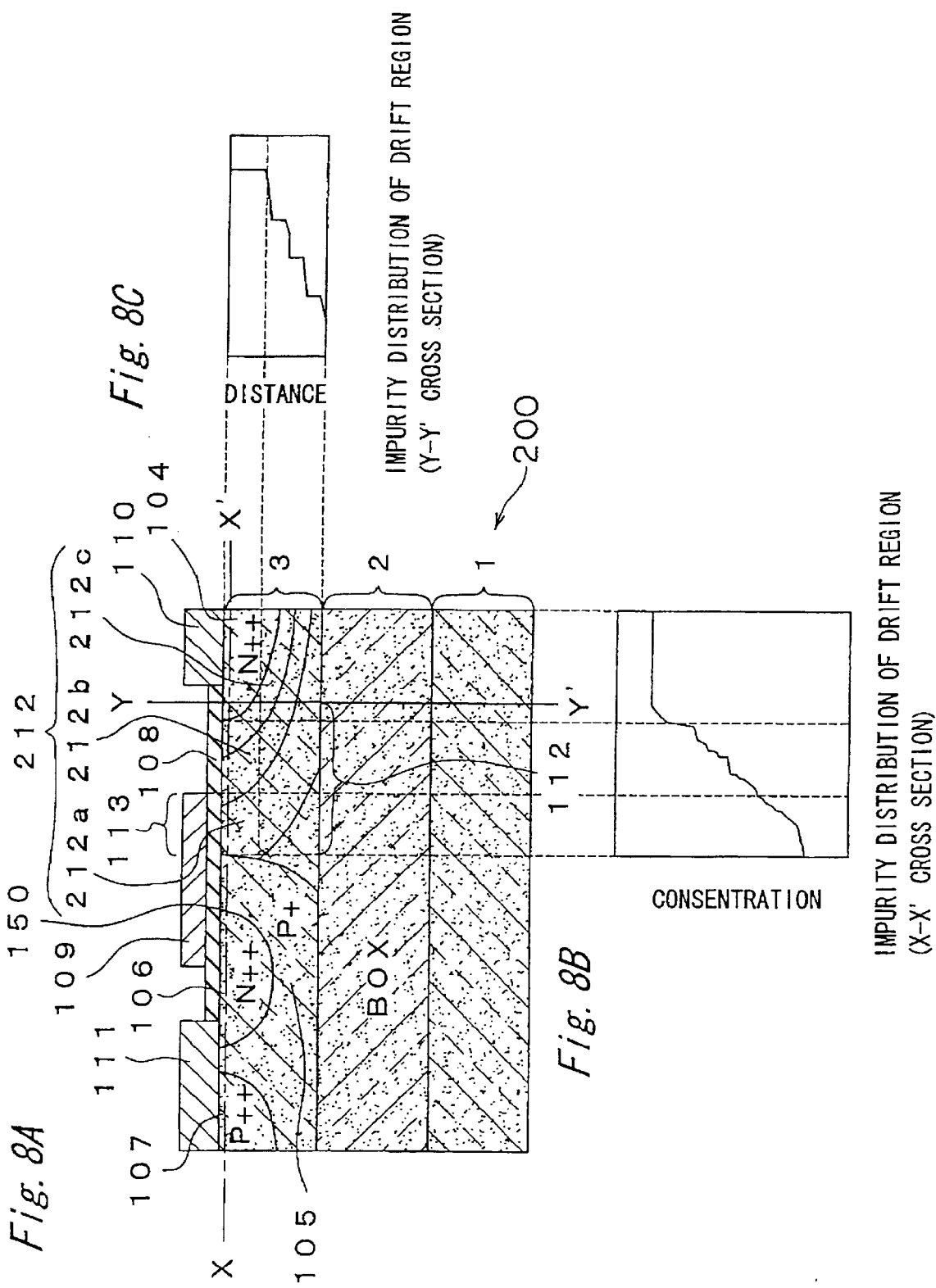

PRIOR ART

SEMICONDUCTOR DEVICE AND PROCESS FOR PRODUCING THE SAME

FIELD OF THE INVENTION

The present invention relates to a semiconductor device for use as a switching element.

BACKGROUND OF THE INVENTION

Recently, the needs of semiconductor switches such as analog switches, semiconductor relays and the like are increasing for use as switches for turning high frequency signals on or off. To use these semiconductor switches for turning on or off high frequency signals, they are required to have linear current-voltage characteristics (having no offset voltage) and low on-state resistance and also to have a small output capacitance in the signal-OFF state so as to improve the high frequency cut-off characteristics.

SOI (silicon-on-insulator)-LDMOSFET (lateral double-diffused MOSFET) is known as a semiconductor element capable of meeting these requirements.

A conventional SOI-LDMOSFET is constructed as follows, using a SOI substrate which comprises a semiconductor substrate (1) formed from a single crystal silicon, an insulating layer (2) formed from a silicon oxide on the semiconductor substrate (1), and a semiconductor layer (3) formed from a single crystal silicon on the insulating layer (2) (see FIG. 10A)).

As shown in FIG. 10A, in this SOI-LDMOSFET, a $p^+$-type well region (5) and an $n^{++}$-type drain region (4) are formed with a space therebetween in the n-type semiconductor layer (3), and an $n^{++}$-type source region (6) is further formed in the $p^+$-type well region (5). In this regard, a part of the $p^+$-type well region (5) and the n-type semiconductor layer (3) are located between the $n^{++}$-type source region (6) and the $n^{++}$-type drain region (4).

In addition, a gate electrode (9) is formed from, for example, a poly-silicon, which is disposed on a gate-insulating layer (8) formed on the $p^+$-type well region (5) between the $n^{++}$-type source region (6) and the $n^{++}$-type drain region (4). The gate electrode (9) is formed overhanging the $n^{++}$-type source region (6) and the drift region located between the $p^+$-type well region (5) and the $n^{++}$-type drain region (4) in the n-type semiconductor layer (3), respectively, taken into account margins for a shift of the position in the process of production.

A source electrode (11) and a drain electrode (10) are formed on the $n^{++}$-type source region (6) and the $n^{++}$-type drain region (4), respectively.

In the conventional SOI-LDMOSFET constructed above as shown in FIG. 10A, while a voltage is being applied across the $n^{++}$-type source region (6) and the $n^{++}$-type drain region (4) through the source electrode (11) and the drain electrode (10), not less than a predetermined voltage is being applied to the gate electrode (9), so that a channel is formed, under strong inversion condition, in a part of the $p^+$-type well region (5) under the gate electrode (9), and that current flows between the $n^{++}$-type source region (6) and the $n^{++}$-type drain region (4) through the channel (the state of ON).

When the voltage to the gate electrode is decreased, the $p^+$-type well region (5) turns into the original p-type Layer, so that a PN junction in reverse bias is formed between the $p^+$-type well region and the $n^{++}$-type drain region (4). As a result, current does not flow between the $n^{++}$-type source region (6) and the $n^{++}$-type drain region (4).

In the SOI-LDMOSFET shown in FIG. 10A, a part of the n-type semiconductor layer (3) between the $p^+$-type well region (5) forming the channel and the $n^{++}$-type drain region (4) is called a drift region (20), and the impurity concentration NO of the drift region (20) is so selected as to satisfy the RESURF condition expressed by the following equation (1).

$$T_{soi} \times NO \approx 1 \times 10^{12} \text{ (atm/cm}^2\text{)} \quad (1)$$

wherein Tsoi represents the thickness of the drift region.

As described above, the conventional SOI-LDMOSFET achieves high withstand voltage by selecting the impurity concentration NO of the drift region (20) so that the above RESURF condition for providing optimal conditions relative to a surface electric field can be satisfied. In this regard, in the SOI-LDMOSFET shown in FIG. 10A, the impurity concentration NO of the drift region (20) is so selected as to be uniform over a whole of the drift region (20).

Lately, structures for further improving the withstand voltage of the SOI-LDMOSFET shown in FIG. 10A are proposed in U.S. Pat. Nos. 5,300,448, 5,412,241 and so on.

In the SOI-LDMOSFET disclosed in U.S. Pat. No. 5,300,448, the n-type drift region (50) locates between the drain region (52) having the drain electrode (56) formed thereon and the source region (51) having the source electrode (54) formed thereon as shown in FIG. 11, and the drift region (50) is so formed that the impurity concentration of the drift region (50) can linearly decrease as the distance from the drain region (52) increases. In addition, a space between the source region (51) and the drift region (50) has a gate electrode (59) formed therein spaced by the gate oxide layer (58) and a p-type base region (60) for forming a channel. Constructed as above, the SOI-LDMOSFET disclosed in U.S. Pat. No. 5,300,448 succeeds in uniforming the surface and the internal electric field of the drift region (50) and thus further improving the withstand voltage.

However, the SOI-LDMOSFET disclosed in U.S. Pat. No. 5,300,448 has a problem in that it is impossible to decrease the length of the drift region (50) (the length along which current flows). This disadvantage comes from the following structure: as shown in FIG. 12, the drift region is formed on the semiconductor layer (3) through a mask having a plurality of openings (40) which are formed so that the distance between each of the openings changes in order and such a semiconductor layer (3) is doped with a predetermined amount of impurity and then treated by heating, so that the impurity concentration of the drift region (50) changes in order. This structure makes it hard to shorten the length of the drift region (50). It is described in U.S. Pat. No. 5,300,448 that the length of the drift region (50) is 40 to 50 μm Therefore, on-state resistance becomes higher because the length of the drift region (50) is long in the SOI-LDMOSFET disclosed in U.S. Pat. No. 5,300,448.

The SOI-LDMOSFET proposed in U.S. Pat. No. 5,300,448 has a further problem in that it is inevitably needed to decrease the thickness of the drift region (50) in order to improve the withstand voltage, which leads to poor heat release. This results in a problem that allowable current in the state of ON can not be increased.

The SOI-LDMOSFET proposed in U.S. Pat. No. 5,412,241 or the like provides the structure which makes it possible to decrease the on-state resistance and to improve the withstand voltage characteristics. However, this SOI-LDMOSFET has a gate-field plate structure and therefore has a problem in that the output capacitance is large.

In the meantime, the switch for turning a high frequency signal on or off is keenly demanded in the voltage class from 20 to 300 V. In case where a SOI-LDMOS of this class is constructed so as to have an ideal structural parameter, it is estimated that the optimal value of the length of the drift region is 1 to 15 μm. However, it is hard to form a drift region having an optimal length of 1 to 15 μm, because the method of producing the SOI-LDMOSFET disclosed in U.S. Pat. No. 5,300,448 has a problem in the processing precision.

The present invention is made to overcome the foregoing problems, and the first object of the present invention is to provide a semiconductor device capable of increasing allowable current in the state of ON while ensuring the demanded withstand voltage and decreasing output capacitance and on-state resistance.

The second object of the invention is to provide a process for readily producing the same semiconductor device with high accuracy.

SUMMARY OF THE INVENTION

A semiconductor device according to the present invention comprising a semiconductor layer formed on a semiconductor substrate, and the semiconductor layer includes a first conductivity type-drain region formed in a part of the semiconductor layer, a second conductivity type-well region formed in a part of the semiconductor layer and apart from the drain region, a first conductivity type-source region formed in the well region and apart from one end of the well region on the side of the drain region, a first conductivity type-drift region formed between one end of the well region and the drain region and in contact with both the well region and the drain region, the impurity concentration of said drift region decreasing both in the lateral direction and in the vertical direction as the distance from the drain region increases, the lateral direction being parallel to the surface of the semiconductor layer, the vertical direction being perpendicular to the surface of the semiconductor layer, a gate oxide layer formed on the well region located between the drift region and the source region, and a gate electrode formed on the gate oxide layer.

Constructed above, a depletion layer is effectively spread in a part of the drift region in contact with the well region, so that the concentration of an electric field can be prevented and that high withstand voltage can be achieved. Further, since the semiconductor layer can be formed with a relative large thickness, the thermal resistance can be decreased, and thus, the allowable current in the state of ON can be increased.

Further, in the semiconductor device according to the present invention, it is preferable that the semiconductor layer is formed on an insulating layer on the semiconductor substrate.

Further, it is preferable that the impurity concentration in the lateral direction of the drift region changes obeying the Gaussian distribution having, as a parameter, the distane x from the drain region in the lateral direction, and that the impurity concentration in the vertical direction of the drift region changes obeying the Gaussian distribution having, as a parameter, the distance y from the drain region in the vertical direction.

By doing so, the impurity concentration distribution in the drift region can be controlled by the diffusion from the side of the drain region in the course of constructing the semiconductor device, so that the semiconductor device can be readily formed with high accuracy.

Further, a semiconductor device capable of having withstand voltage of 20 to 300 V class which is widely demanded for switches for turning high frequency signals on or off, and having a drift length of about 1 to about 15 μm can be easily constructed.

Further, it is preferable that the gate electrode is formed so as to overhang the drift region as if covering a part of the drift region, and that the impurity concentration of the part of the drift region locating just under the gate electrode is lower than the impurity concentration N(RESURF) which satisfies the RESURF condition.

Thus, the on-state resistance can be held lower, and the output capacitance can be effectively decreased.

Further, it is preferable that the impurity concentration of a part of the drift region in the vicinity of the drain region is higher than the impurity concentration N(RESURF) which satisfies the RESURF condition Thus, the on-state resistance can be decreased.

In this regard, the RESURF condition referred to herein is to satisfy the following equation.

$$Tsoi \times N(RESURF) \approx 1 \times 10^{12} \text{ (atm/cm}^2)$$

Tsoi: the thickness of the semiconductor layer (cm)
N(RESURF): the impurity concentration (atm/cm$^3$) satisfying the RESURF condition Further, it is preferable that the thickness t of the semiconductor layer is set within a rang of $0.3 \ \mu m \leq t \leq 15 \ \mu m$.

By selecting the thickness t of the semiconductor layer so as to satisfy the requirement of $0.5 \ \mu m \leq t \leq 4 \ \mu m$, the resultant semiconductor device as a switching element can have withstand voltage of 25 to 100 V class and show excellent high frequency wave characteristics.

Further, by selecting the thickness t of the semiconductor layer so as to satisfy the requirement of $0.5 \ \mu m \leq t \leq 1.5 \ \mu m$, the resultant semiconductor device as a switching element can have withstand voltage of 25 to 50 V class and show excellent high frequency wave characteristics.

Further, it is preferable that the lateral distance of the drift region from one end of the drain region to one end of the well region is set 15 μm or less. By doing so, the on-state resistance can be decreased. Further, by doing so, the impurity concentration distribution can be formed in practical time by the diffusion from the side of the drain region.

Another aspect of the present invention relates to a process for constructing a semiconductor device comprising a semiconductor layer formed on a semiconductor substrate, and the process comprises the steps of separately forming a first conductivity type-drain region and a first conductivity type-source region apart from each other, forming a drift region between the drain region and the source region and in contact with the drain region, and forming a channel region in contact with the source region. The process of the present invention is characterized by comprising the steps of doping a region for forming the drain region with a first conductivity type-impurity, and heating and diffusing the impurity in the drift region.

According to the process of the present invention, there can be formed such a drift region that the impurity concentration in the lateral direction changes obeying the Gaussian distribution using, as a parameter, the distance x from the drain region in the lateral direction, and that the impurity concentration in the vertical direction changes obeying the Gaussian distribution using, as a parameter, the distance y from the drain region in the vertical direction.

Further, according to the process of the present invention, the introduction of the impurity into the drain region and the

BRIEF DESCRIPTION OF THE DRAWINGS

FIG. 8A is a sectional view of a LDMOSFET according to the second embodiment of the present invention.

FIG. 8B is a graph showing the substantial impurity concentration distribution of the section of the LDMOSFET on line X-X' in FIG. 8A.

FIG. 8C is a graph showing the substantial impurity concentration distribution of the section of the LDMOSFET on line Y-Y' in FIG. 8A.

DESCRIPTION OF THE INVENTION

Hereinafter, the present invention will be described in more detail by way of preferred embodiments thereof, which should not be construed as limiting the scope of the present invention, any way. For the convenience of simplicity in the description, the first conductivity type-type and the second conductivity type-type as are put in the section of "Disclosure of the Invention" and the claims are referred to as n-type and p-type, respectively, however, the n-type and the p-type may be replaced with each other. Also, while the following description is made restrictively about SOI-LDMOSFET, a LDMOSFET may be formed on an epitaxial wafer.

First Embodiment

A SOI-LDMOSFET according to this embodiment is constructed as follows, using a SOI substrate which comprises a semiconductor substrate (1) formed from a single crystal silicon, an insulating layer (2) formed thereon from a silicon oxide, and a semiconductor layer (3) formed thereon from a single crystal silicon.

Figure 1:
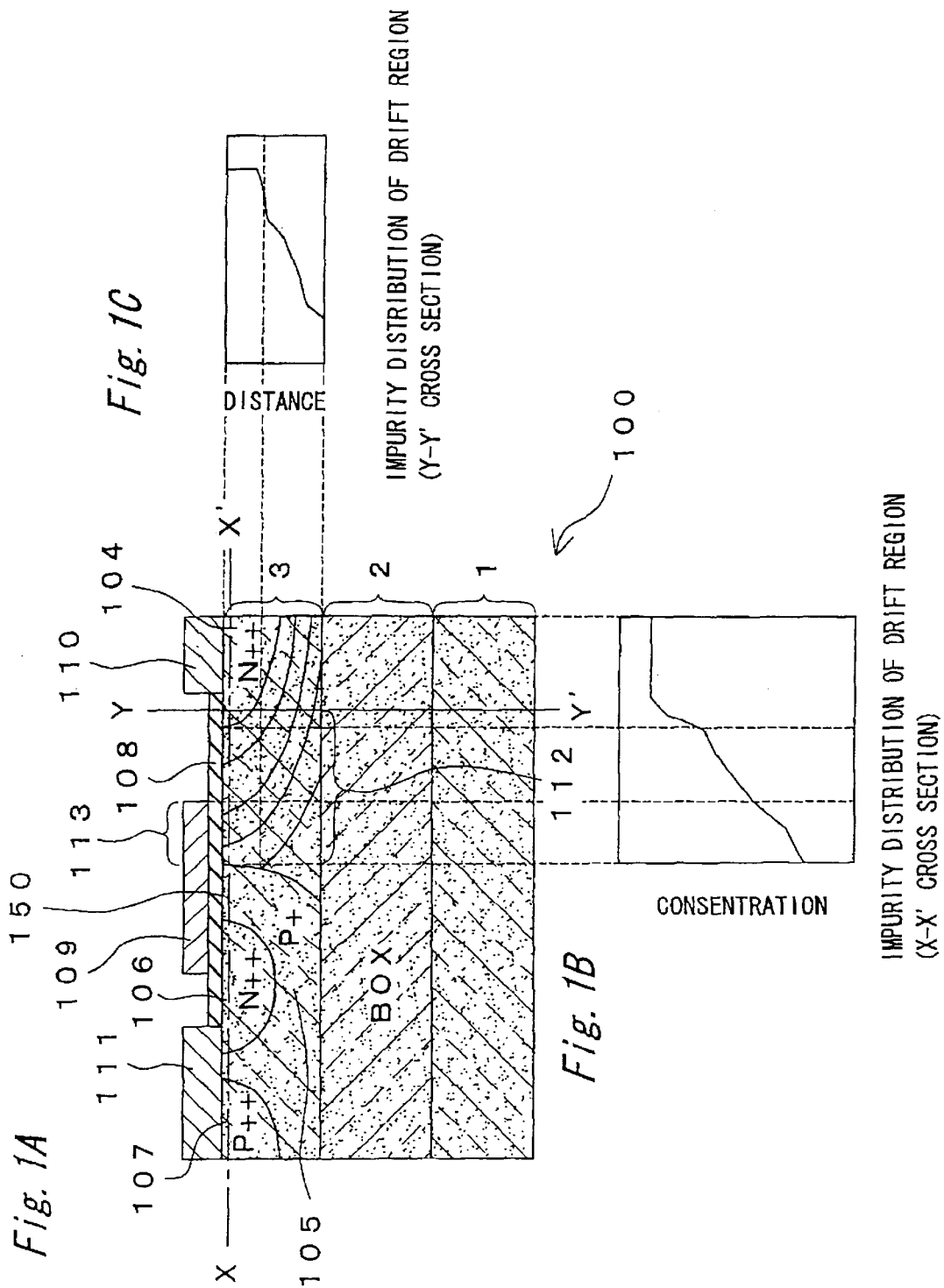
FIG. 1A is a sectional view of a LDMOSFET according to the first embodiment of the present invention.
FIG. 1B is a graph showing the substantial impurity concentration distribution of the section of the LDMOSFET on line X-X' in FIG. 1A.
FIG. 1C is a graph showing the substantial impurity concentration distribution of the section of the LDMOSFET on line Y-Y' in FIG. 1A.

In this SOI-LDMOSFET shown in FIG. 1A, such a $p^+$-type well region (105) that has a depth reaching the insulating layer (2) is formed at a predetermined position in the n-type semiconductor layer (3), and an $n^{++}$-type drain region (104) is formed apart from the $p^+$-type well region (105).

An $n^{++}$-type source region (106) is formed in the $p^+$-type well region (105), and a $p^{++}$-type base contact region (107) is formed in adjacent to the $n^{++}$-type source region (106).

The $p^+$-type well region (105) having a channel region (150) formed thereon and the n-type semiconductor layer (3) (the drift region (112)) are located between the $n^{++}$-type source region (106) and the $n^{++}$-type drain region (104).

A gate electrode (109) of, for example, a poly-silicon is formed on a gate-insulating layer (108) which is formed on the $p^+$-type well region (105) (or the channel region (150)) between the $n^{++}$-type source region (106) and the $n^{++}$-type drain region (104).

In the present specification, a part of the n-type semiconductor layer (3) between the $p^+$-type well region (105) forming the channel region (150) formed thereon just under the gate electrode and the $n^{++}$-type drain region (104) is referred to as an n-type drift region (112).

In the first embodiment of the present invention, the gate electrode (109) is formed overhanging the n-type drift region (112) by a predetermined length, and this portion overhanging the n-type drift region (112) is referred to as a gate overhanging region (113), and the length of such a portion is referred to as a gate overhanging length.

A drain electrode (110) is formed on the $n^{++}$-type drain region (104), and a source electrode (111) is formed on and across the $n^{++}$-type source region (106) and the $p^{++}$-type base contact region (107).

The SOI-LDMOSFET constructed as above according to the first embodiment shown in FIG. 1A can turn current on or off between the drain region and the source region depending on a voltage applied to the gate electrode in the same manner as in the conventional SOI-LDMOSFET, and further can have superior characteristics described later to the conventional one, by constructing the n-type drift region (112) as follows.

In the SOI-LDMOSFET according to the first embodiment, the impurity concentration of the n-type drift region (112) is adjusted to gradually decrease in both of the vertical direction (the thickness direction of the semiconductor layer, which is perpendicular to the surface of the semiconductor layer) and the lateral direction (the direction parallel to the surface of the semiconductor layer) as the distance from the $n^{++}$-type drain region (104) increases, as shown in FIGS. 1B and 1C.

FIG. 1B is a graph showing the impurity concentration distribution in the vicinity of the surface of the n-type drift region (112) in the lateral direction, and indicating the impurity concentration of a part of the surface of the n-type drift region (112) relative to the distance X from the reference point (the interface between the n-type drift region (112) and the n++-type drain region (104)) in the lateral direction.

FIG. 1C is a graph showing the impurity concentration of the n-type drift region (112) relative to the distance Y from the surface of the semiconductor layer (3) in the depth direction (the vertical direction).

Figure 2:
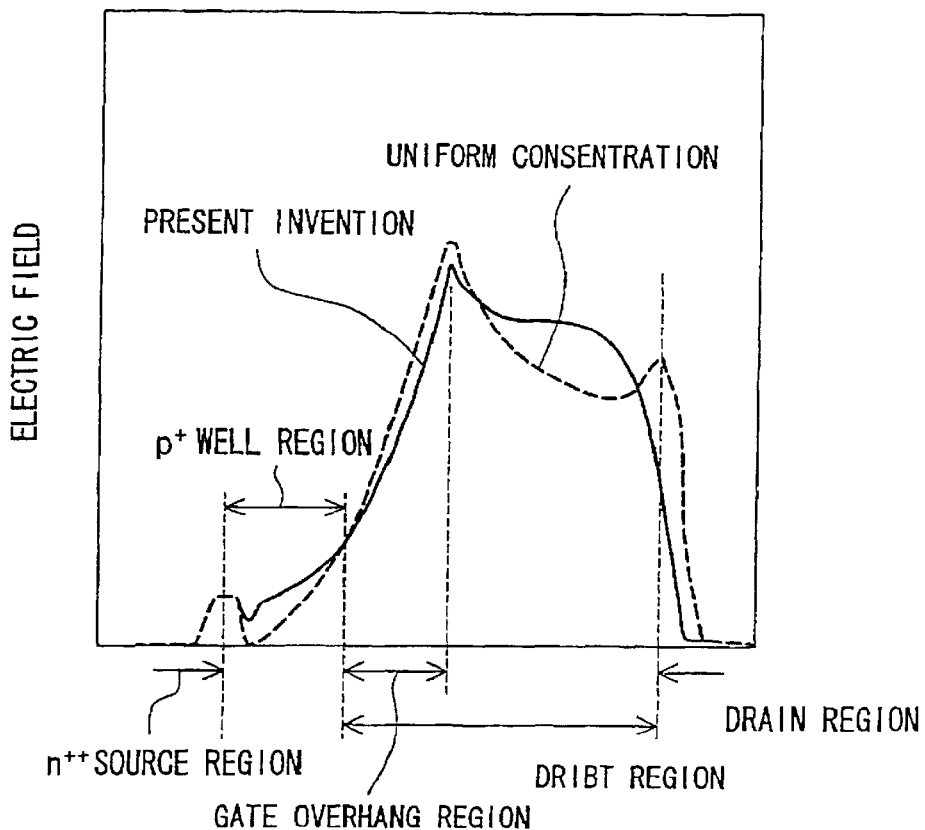
FIG. 2 is a graph showing the electric field distribution in the section of the LDMOSFET on line X-X' in FIG. 1A, in comparison with that of a conventional SOI element.

In the SOI-LDMOSFET (100) constructed above according to the first embodiment, the impurity concentration of the n-type drift region (112) is adjusted to gradually decrease toward the p+-type well region (105) from the n++-type drain region (104). Thus, as shown in FIG. 2, the electric field concentrated around the region which is defined by the drift region beneath the gate overhanging region is relieved to form a more uniform electric filed distribution in the n-type drift region (112).

Figure 3:
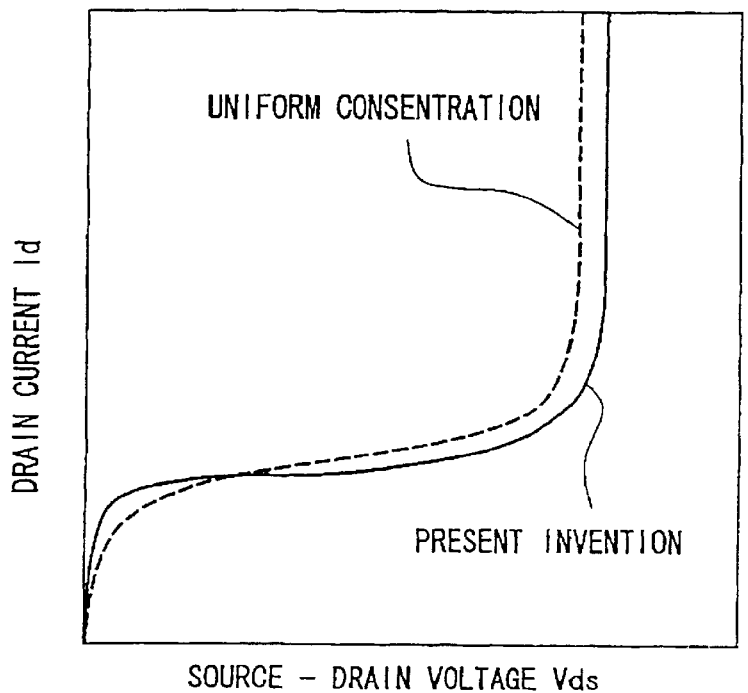
FIG. 3 is a graph showing the current-voltage (I-V) curve of the LDMOSFET according to the first embodiment of the present invention, in comparison with that of a conventional SOI element.

By doing so, the SOI-LDMOSFET of the first embodiment can have higher avalanche breakdown point as shown in FIG. 3.

Also, in the SOI-LDMOSFET (100) of the first embodiment, the impurity concentration of a part of the n-type drift region (112) in the vicinity of the junction between the p+-type well region (105) and the n-type drift region (112) is adjusted to be lower, and particularly, the impurity concentration is adjusted to be as low as the initial concentration level of the n-type semiconductor layer (3) in the vicinity of the insulating layer (2). Therefore, even when a voltate is not applied to the n++-type drain region, a depletion layer is effectively spread from the junction between the p+-type well region (105) and the n-type drift region (112) toward the n++-type drain region (104) within the n-type drift region (112).

Thus, it becomes possible to increase the width of the depletion layer of the n-type drift region (112) in the state of OFF and therefore also possible to decrease the capacitance between the source region and the drain region.

Further, since the impurity concentration can be changed in not only the lateral direction but also the vertical direction, it is possible to form the n-type drift region (112) with a relatively large thickness.

The increasing thickness of the drift region makes it possible to decrease the thermal resistance efficiently, so that allowable current in the state of ON can be increased. Therefore, the SOI-LDMOSFET can permit a relatively large amount of current to pass through in the state of ON.

As is understood from the foregoing, the SOI-LDMOSFET (100) of the first embodiment can have withstand voltage closer to an ideal value and also increase the amount of allowable current in the state of ON.

Hereinafter, more preferred modes of the SOI-LDMOSFET (100) according to the first embodiment will be described, however, the scope of the present invention should not be restricted to the details of the following construction.

(1) Impurity Concentration Distribution of n-Type Drift Region (112)

In the present invention, it is preferable that the impurity concentration of the n-type drift region (112) is so adjusted as to change obeying the Gaussian distribution represented by the following equation (2).

$$N(x,y) \approx N peak \cdot \exp(-(x/Lx)^2) \cdot \exp(-(y/Ly)^2) \quad (2)$$

wherein the parameters and the constants in the equation (2) are defined as below:

x: the distance from an end of the n++-type drain region (104) on the surface of the n-type drift region (112)

y: the distance in the thickness direction from the surface of the semiconductor layer within the n-type drift region (112)

N(x,y): the impurity concentration of a position. represented by coordinates (x,y)

Npeak: the highest impurity concentration of the n-type drift region (112)

Lx: the diffusion length of an impurity in the lateral direction in the n-type drift region (112)

Ly: the diffusion length of an impurity in the thickness direction in the n-type drift region (112)

This impurity concentration distribution of the n-type drift region (112) which changes obeying the Gaussian distribution is determined by the distance from the end of the n++-type drain region (104) as the reference point, and therefore, the impurity concentration distribution of the n-type drift region (112) can be controlled by the diffusion from the side of the n++-type drain region (104).

Therefore, the n-type drift region (112) having the impurity concentration distribution which changes obeying the Gaussian distribution is not required to be subjected to highly accurate mask-processing which is essential for the construction of the conventional SOI-LDMOSFET, and therefore, it is readily formed.

In addition, since this n-type drift region (112) is not restricted by mask-processing accuracy, the SOI-LDMOSFET can have a short drift length.

Therefore, the use of the n-type drift region (112) having the impurity concentration distribution which changes obeying the Gaussian distribution makes it easy to construct a highly accurate SOI-LDMOSFET capable of having withstand voltage of 20 to 300 V class which is well required for a switch for turning a high frequency signal on or off and capable of having a drift length of about 1 to about 15 μm.

(2) Impurity Concentration of n-Type Drift Region (112) Under Gate Overhanging Region (113)

It is preferable that the impurity concentration of a region (under gate overhanging region) located under the gate overhanging region (113) within the n-type drift region (112) is adjusted to be lower than the impurity concentration N(RESURF) which satisfies RESURF condition given by the following equation (3).

$$Tsoi \times N(RESURF) \approx 1 \times 10^{12} \text{ (atm/cm}^2\text{)} \quad (3)$$

wherein the parameters and the constants in the equation (3) are defined as follows:

Tsoi: the thickness of the n-type semiconductor layer (3) (cm)

N(RESURF): the impurity concentration (atm/cm³) satisfying RESURF condition.

As mentioned above, by adjusting the impurity concentration of the under gate overhanging region of the n-type drift region (112) to be N(RESURF) or lower, a depletion layer can be more effectively spread in the n-type drift region (112) in the state of OFF where the gate voltage is negative or at zero potential Thus, it becomes possible to increase the width of the depletion layer of the n-type drift region (112) in the state of OFF, which makes it possible to decrease the capacitance between the source region and the drain region.

Particularly, in the state of OFF, it becomes possible to make very low the impurity concentration of a part of the n-type drift region (112) in the vicinity of the junction between the n-type drift region (112) and the p+-type well region (105) and also in the vicinity of the insulating layer (2), and therefore, it becomes very easy to spread the depletion layer in such a region having a very low impurity concentration. As a result, the effect of decreasing the output capacitance is more remarkably exhibited.

Further, in the state of ON where ON gate voltage (in this case, it is positive voltage) is applied to the gate electrode (109), carriers (electrons) are accumulated in the under gate overhanging region of the n-type drift region (112) because of the potential of the gate electrode (109). Therefore, the carrier concentration in the state of ON can be relatively high as in the case where the impurity concentration is set at a value equal to or greater than the value of N(RESURF), in spite of the condition under which the impurity concentration of the above region is set at a low value (N(RESURF) or less).

Therefore, by setting the impurity concentration of the under gate overhanging region lower than N(RESURF), it becomes possible to increase the allowable current in the state of ON while an ideal withstand voltage being held and also possible to effectively decrease the output capacitance without an increase in the on-state resistance.

(3) It is preferable that the impurity concentration of a part of the n-type drift region (112) in the vicinity of the $n^{++}$-type drain region (104) and also in the vicinity of the surface of the n-type drift region (112) (high concentration region) should be selected to a value higher than the impurity concentration N(RESURF) which satisfies the above RESURF condition.

As described above, when a region having a higher impurity concentration than N(RESURF) is formed in the n-type drift region (112), the carrier concentration in such a high impurity concentration region naturally becomes higher. Most of current which flows in the state of ON flows in the vicinity of the surface of the n-type drift region. Thus, by increasing the carrier concentration in the vicinity of the surface, the on state resistance can be decreased.

In this case, the output capacitance can be suppressed without an increase in the on state resistance, by adjusting the impurity concentration of the part of the n-type drift region (112) just under the gate overhanging region (113) to a value lower than N(RESURF).

Therefore, by forming a region having a higher impurity concentration than N(RESURF) in the n-type drift region (112), the allowable current in the state of ON can be increased while the ideal withstand voltage being ensured, and also, the on-state resistance can be effectively decreased without an increase in the output capacitance.

(Production Process of LD-MOSFET of First Embodiment)

Next, the production process of an LD-MOSFET according to the first embodiment of the present invention will be described with reference to FIGS. 7A to 7H.

This process relates to a case where an impurity concentration distribution obeying the Gaussian distribution is formed in the n-type drift region.

First, an oxide layer is formed on the surface of a SOI substrate which comprises a substrate (1) formed from a single crystal silicon or the like, an insulating layer (2) formed thereon from a silicon oxide or the like, and a semiconductor layer (3) formed thereon from a single crystal silicon or the like.

Figure 7A:
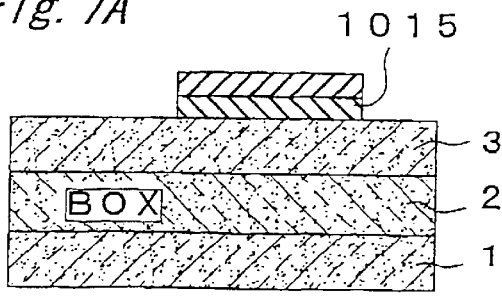
FIGS. 7A to 7H are sectional views in the production process, illustrating the steps of the production process the first embodiment of the present invention.

Then, an oxide layer (1015) is formed by removing parts of the above oxide layer into which impurities will be doped to form a $p^+$-type well region, an $n^{++}$-type drain region and so on (see FIG. 7A).

Figure 7B:
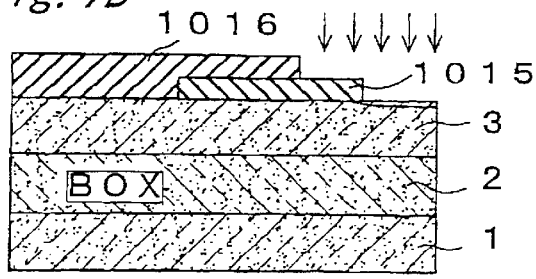

Next, the regions other than a region on which an $n^{++}$-type drain region (104) will be formed are covered by a resist mask (1016), and then, an n-type impurity is implanted into that region above (see FIG. 7B). The n-type impurity is diffused by heat treatment so as to have a predetermined diffusion length. An impurity diffusion distribution obeying the Gaussian distribution represented by the equation (2) is formed in the n-type drift region (112) by controlling the temperature and the time of the heat treatment step. In this regard, the pattern of this distribution is shown by the plurality of lines on FIGS. 1 and 7C which are contour lines, and thus, in practice, the impurity concentration continuously changes according to the equation (2).

Figure 7C:
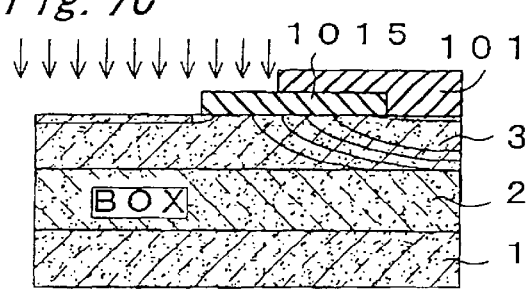

Next, as shown in FIG. 7C, an impurity for forming a $p^+$-type well region (106) is implanted through the oxide layer (1015) as a mask and a resist mask (1017), and the impurity is diffused by heating so as to form the $p^+$-type well region (106) which reaches up to the insulating layer (2).

Figure 7D:
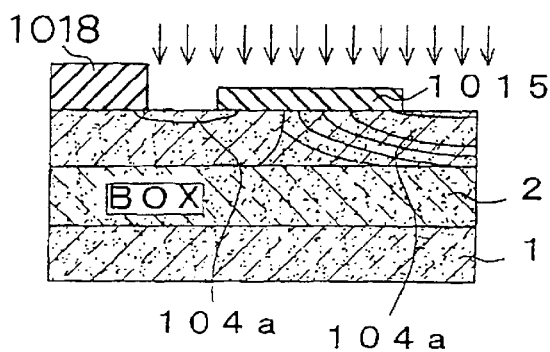

Next, a resist mask (1018) for forming the $n^{++}$-type source region (106) and the $n^{++}$-type drain region (104) is formed, and an n-type impurity is implanted through the resist mask (1018) and the silicon oxide layer (1015) as a mask to thereby form n-type impurity-implanted regions (106a) and (104a) (see FIG. 7D).

Figure 7E:
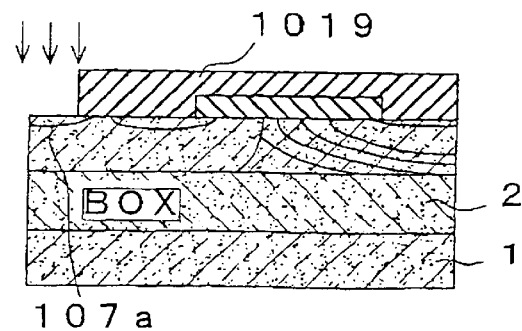

Next, the resist mask (1018) is removed, and then, a resist mask (1019) for forming a $p^{++}$-type base contact region is formed, and a p-type impurity is introduced through the mask to form a p-type impurity-implanted region (107a) (see FIG. 7E).

After the resist mask (1019) is removed, heat treatment is carried out so as to diffuse the respective impurities in the n-type impurity-implanted regions (104a),(106a) and the p-type impurity-implanted region (107a), so that the $n^{++}$-type drain region (104), the $n^{++}$-type source region (106) and the $p^{++}$-type base contact region (107) are formed, respectively.

Figure 7F:
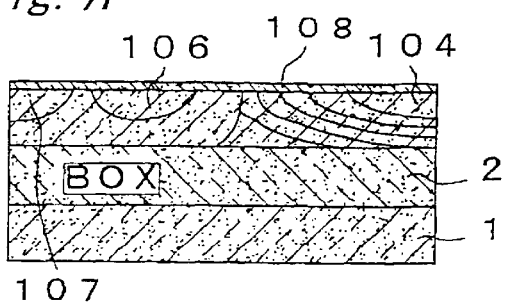

Then, a silicon oxide layer (108) for a gate oxide layer is formed (see FIG. 7F).

Figure 7G:
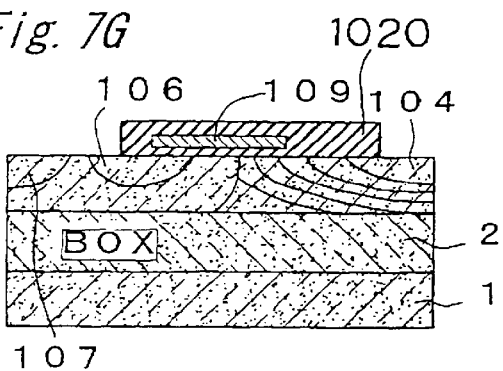
Figure 7H:
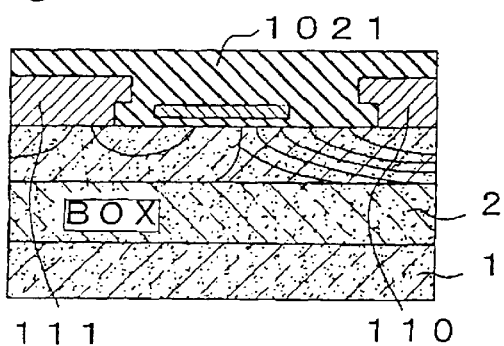

Next, a gate electrode (109) is formed on the silicon oxide layer (108), and an intermediate layer (1020) is further formed, and a part of the intermediate layer (1020) for forming drain, source and base contact regions is removed by etching (see FIG. 7G).

Then, a drain electrode (110) and a source electrode (111) are formed, and a protective layer (1021) is formed. Thus, the LDMOSFET according to the first embodiment is completed.

In the foregoing production process of the LDMOSFET according to the first embodiment, the impurity concentration distribution of the n-type drift region, the well region, the drain region and the source region are formed in an self alignment manner, using the oxide layer (1015) as the mask. Therefore, a very fine semiconductor element can be accurately produced.

In addition, the impurity concentration distribution of the n-type drift region (112) can be formed according to the distance from the $n^{++}$-type drain region so as to obey the Gaussian distribution (Thickness of n-Type Drift Region (112) and Related Characteristics)

Next, the relationship between the thickness of the n-type drift region (112) (the n-type semiconductor layer (3)) and the drift length, and the characteristics of the first embodiment is described.

(1) n-Type Drift Region (112) with Thickness of Substantially 0.3 µm

In the SOI-LDMOSFET according to the first embodiment of the present invention, the n-type drift region (112) can be formed with a thickness of substantially 0.3 µm. Also, in this case, the foregoing effects can be obtained.

Figure 4:
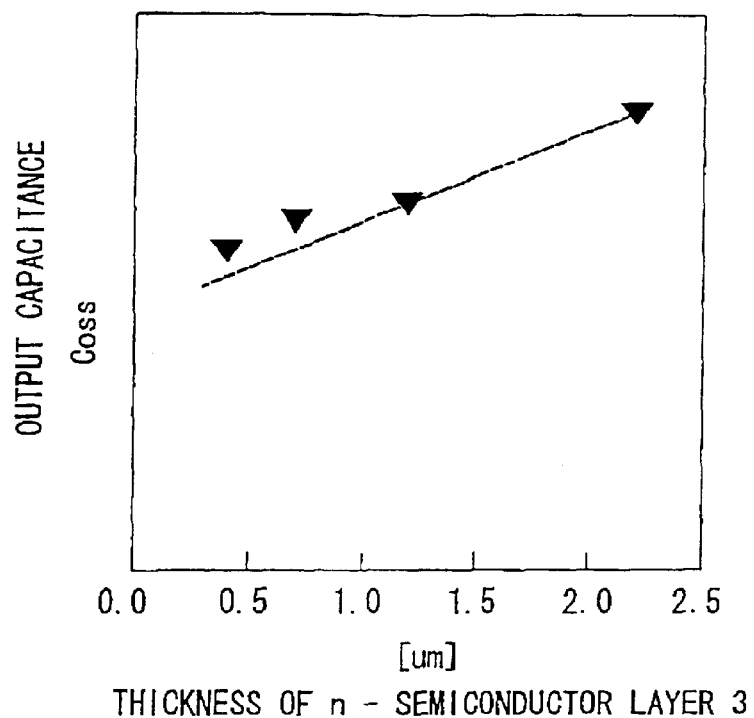
FIG. 4 is a graph showing the output capacitance relative to the thickness of the semiconductor layer (3) according to the first embodiment of the present invention.

By forming the n-type semiconductor layer (3) with a relatively thin thickness as above, the area of the junction between the n-type drift region (112) and the p-type well region (105) can be decreased, and thus, the output capacitance can be decreased substantially in proportion to the thickness of the semiconductor layer (3) as shown in the graph of FIG. 4.

In the meantime, in the construction of the first embodiment, by the heat diffusion of the impurities, there is formed, in the n-type drift region (112), such an impurity concentration distribution that the impurity concentration gradually decreases also in the vertical direction from the surface of the n-type semiconductor layer (3) to the insulating layer (2). Such an impurity concentration distribution can be formed when the thickness of the n-type semiconductor layer is about 0.3 μm.

However, if the thickness of the n-type semiconductor layer is thinner than 0.3 μm, the distance between the $n^{++}$-type source region (106) and the insulating layer (2) becomes smaller, and because of the built-in potential, there is formed such a depletion layer that spreads from the junction between the $n^{++}$-type source region (106) and the $p^+$-type well region (105) into the interior of the $p^+$-type well region (105). As a result, the $p^+$-type well region (105) between the $n^{++}$-type source region (106) and the insulating layer (2) is apt to come into a pinch-off condition.

Because of this disadvantage, a body-floating phenomenon which causes an unstable potential in the $p^+$-type well region (105) just under the gate electrode (109) occurs, which leads to a problem that the withstand voltage and the tolerance dose lower.

Therefore, it is preferable in the present invention that the thickness of the n-type semiconductor layer (3) should be 0.3 μm or more.

(2) n-Type Drift Region (112) with Thickness of Substantially 15 μm

According to this embodiment, the SOI-LDMOSFET may include an n-type semiconductor layer (3) with a thickness of 15 μm.

In this case, it is preferable that the drift distance (the width of the n-type drift region (112)) from an end of the $p^+$-type well region (105) extending along the surface of the n-type semiconductor layer (3) to an end of the $n^{++}$-type drain region (104) should be selected to about 15 μm.

As mentioned above, in the SOI-LDMOSFET according to the first embodiment, even if the n-type semiconductor layer (3) has a thickness of 15 μm the foregoing effects can be obtained.

More specifically, in most of cases, there is a relationship of (withstand voltage) (drift distance) between the withstand voltage and the drift distance. It is confirmed by experiments that, when the drift distance is set at 15 μm, the highest withstand voltage is indicated at 300 V in the case of a switch of ~300 V class which is acutely demanded as a switch for turning a high frequency signal on or off (see FIG. 5).

As described above, it is confirmed, from the results of the various tests we have conducted, that relatively good features can be ensured when the thickness of the n-type semiconductor layer (3) is substantially in the range of 0.3 to 15 μm. Therefore, when a decrease in output capacitance is needed while it is allowed for the withstand voltage to be relatively low, the thickness of the n-type semiconductor layer (3) is decreased. On the other hand, when higher withstand voltage is required, the thickness of the n-type semiconductor layer (3) is increased.

Further, by increasing the thickness of the n-type semiconductor layer (3), heat can be efficiently released through the n-type drift region (112), so that the resulting element can have an improved thermal resistance feature. Thus, it becomes possible to increase the allowable current in the state of ON.

However, there remains the following problems. When the foregoing impurity concentration gradient is formed in the n-type drift region having a thickness of 15 μm or more, the time taken in diffusing impurities by heat becomes longer. When the impurities are diffused from the surface of the semiconductor layer with a thickness of 15 μm or more, the diffusing speed becomes lower as the impurity diffusion distance becomes longer and longer. Therefore, it is preferable in the present invention that the thickness of the n-type semiconductor layer (3) should be 15 μm or less.

As mentioned above, according to the SOI-LDMOSFET of the first embodiment of the present invention, it is possible to form the n-type drift region (112) with a thickness of about 15 μm, and therefore possible to construct the SOI-LDMOSFET in practical time, having very high withstand voltage (to about 300 V) and also a large amount of allowable current in the state of ON.

(3) n-Type Drift Region (112) with Thickness of Substantially 0.5 μm

It is preferable in the present invention that the thickness of the n-type drift region (112) should be set at 0.5 μm or more so as to hold the output capacitance relatively small, and the reason therefor is described below.

There is the following relationship between the thickness of the n-type semiconductor layer (3), and the output capacitance and on-resistance:

(Output capacitance)×(on-resistance) (Thickness of n-type semiconductor layer (3))

Figure 6:
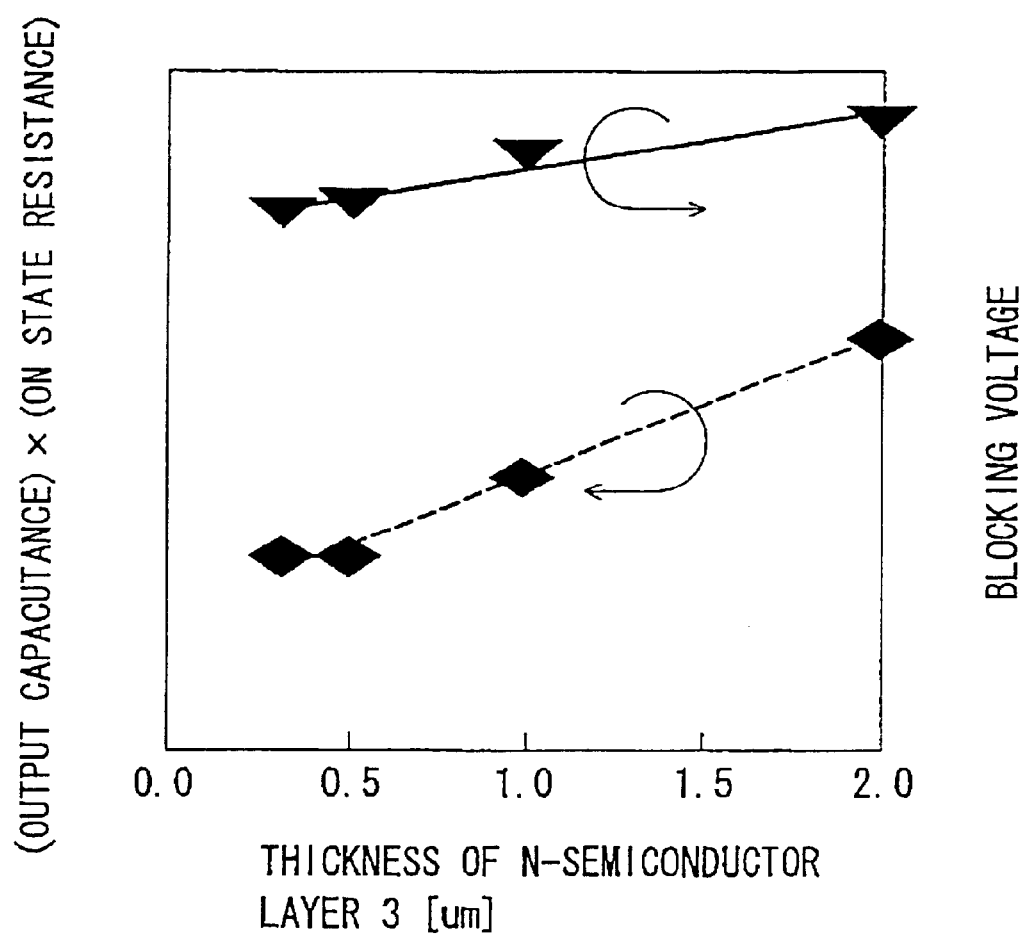
FIG. 6 is a graph showing the value of (output capacitance) X (on-state resistance) and the withstand voltage relative to the thickness of the semiconductor layer (3) according to the first embodiment of the present invention.

It is confirmed by experiments that, when the thickness of the n-type semiconductor layer (3) becomes thinner than about 0.5 μm, decrease in the value of (output capacitance)× (on-state resistance) is gradually saturated (see FIG. 6).

On the other hand, as shown in FIG. 6, the withstand voltage further lowers when the thickness of the n-type semiconductor layer (3) becomes thinner than about 0.5 μm.

Thus, in case where the thickness of the n-type semiconductor layer (3) is decreased to less than about 0.5 μm, it is impossible to decrease the value of (output capacitance)× (on-state resistance) in spite of sacrificing the withstand voltage.

Therefore, it is preferable that a design for decreasing the value of (output capacitance)×(on-state resistance) should be made after a required withstand voltage has been ensured by setting the thickness of the n-type semiconductor layer (3) at about 0.5 μm or more.

Thus, it is preferable to set the thickness of the n-type semiconductor layer (3) at 0.5 μm or more in order to increase the allowable current in the state of ON while ensuring high withstand voltage and also to efficiently decrease the value of (output capacitance)×(on-state resistance).

(4) n-Type Drift Region (112) with Thickness of Substantially 4 μm and Drift Length of about 4 μm The following features are obtained, in case where, in the SOI-LDMOSFET of the present invention, the thickness of the n-type semiconductor layer (3) is set at about 4 μm, and where the length of the n-type drift region (112) (in other words, the drift distance) from an end of the $p^+$-type well region (105) to an end of the $n^{++}$-type drain region (104) is set at about 4 μm.

As described above, there is the relationship of (withstand voltage) (drift distance) between the withstand voltage and the drift distance.

Figure 5:
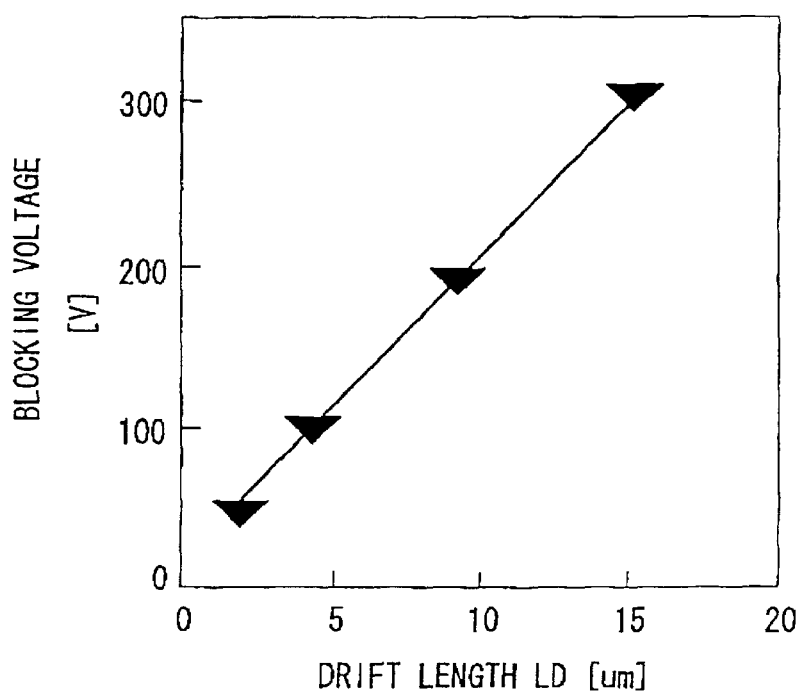
FIG. 5 is a graph showing the withstand voltage relative to the drift distance according to the first embodiment of the present invention.

It is confirmed by experiments that, by setting the drift distance at 4 μm and the thickness of the n-type semiconductor layer (3) at about 4 μm based on this relationship, the withstand voltage can achieve the class of 100 V (see FIG. 5).

In addition, by setting the thickness of the n-type semiconductor layer (3) at a larger value in order to achieve the above withstand voltage, the thermal resistance is decreased, and therefore, the allowable current in the state of ON can be increased.

For this reason, according to the SOI-LDMOSFET of this embodiment, by setting the drift distance at 4 µm and the thickness of the n-type semiconductor layer (3) at about 4 µm, it is possible to provide a switching element capable of turning a high frequency signal on or off, ensuring withstand voltage of 100 V class which is acutely demanded for relatively high voltage-resistant switching elements, and increasing the allowable current in the state of ON.

It is understood from the foregoing descriptions (1) to (4) that, according to the present invention, the thickness of the n-type semiconductor layer (3) should be selected within a range of 0.5 to 4 µm in accordance with the requirement of end use, in case where the withstand voltage is required to achieve the class of 100 V, and where the output capacitance and the on-state resistance are required to be relatively small.

Also, according to the present invention, the thickness of the n-type semiconductor layer (3) should be selected within a range of 4 to 15 µm in accordance with the requirement of end use, in case where the withstand voltage is required to achieve the class of 100 to 300 V.

(5) Element Having Voltage Resistance of 25 to 50 V Class

Next, an element having withstand voltage of 25 to 50 V class which has the largest demand in the switches for turning high frequency signals on or off is constructed according to the first embodiment of the present invention.

This element is constructed taken into account the variation in the thickness of the n-type semiconductor layer (3) within a range of about 0.5 to about 1.5 µm which is found when the n-type semiconductor layer (3) is formed on a SOI substrate.

Specifically, the length of the n-type drift region (112) (in other words, the drift distance) from an end of the p$^+$-type well region (105) extending along the surface of the n-type semiconductor layer (3) to an end of the n$^{++}$-type drain region (104) is selected within a range of 1 to 2 µm.

By doing so, it is confirmed by experiments that the drift distance of 1 to 2 µm makes it possible to achieve withstand voltage of 25 to 50 V class which has the largest demand in the switching elements for turning high frequency signals on or off (see FIG. 5).

As has already been described in the section (3), it is known that the thickness of the n-type semiconductor layer (3) should be set at about 0.5 µm in order to efficiently decrease the value of (output capacitance)×(on-state resistance) (see FIG. 6).

In the state of the present technical level, the thickness of the n-type semiconductor layer (3) formed on a provided SOI wafer has a variation of about 0.5 to about 1.5 µm because of the limit in controllability of growth of thin layers and so on. However, according to the SOI-LDMOSFET of this embodiment of the present invention, by selecting the drift distance within the range of 1 to 2 µm, a withstand voltage of 25 to 50 V class can be achieved, and the value of (output capacitance)×(on-state resistance) can be decreased to a relatively small value, and further, the allowable current in the state of ON can be increased to a relatively large value.

Second Embodiment

As shown in FIG. 8A, a LDMOSFET (200) according to the second embodiment of the present invention is constructed in the same manner as in the LDEMOSFET according to the first embodiment, except that an n-type drift region (212) in which the impurity concentration changes stepwise is formed instead of the n-type drift region (112) of the LDEMOSFET of the first embodiment in which the impurity concentration continuously changes.

In this regard, in FIG. 8A, the same reference numerals are used for the same parts as those shown in FIG. 1A.

In the LDMOSFET (200) according to the second embodiment, the n-type drift region (212) comprises a low concentration region (212a), a medium concentration region (212b) and a high concentration region (212c), and the impurity concentration becomes higher as the distance from the n$^{++}$-type drain region (104) becomes shorter.

In the second embodiment, the low concentration region (212a) locates just under the gate overhanging region (113) of the gate electrode (109) and the high concentration region (212c) locates in contact with the n$^{++}$-type drain region (104).

It is preferable that the impurity concentration Na of the low concentration region (212a) of the n-type drift region (212) should be set at a value not more than N(RESURF), and that the impurity concentration Nc of the high concentration region (212c) thereof should be set at a value not less than N(RESURF).

The impurity concentration Nb of the medium concentration region (212b) may be set at a value equal to the value of the impurity concentration Na of the low concentration region (212a) or that Nc of the high concentration region (212c), and preferably, Nb is set at a value satisfying the condition of Na<Nb<Nc.

The n-type drift region (212) may have an impurity concentration distribution in which each of the low concentration region (212a), the medium concentration region (212b) and the high concentration region (212c) has an impurity concentration distribution in which the concentration of each impurity becomes lower as the distance from the n$^{++}$-type drain region (104) becomes longer. In this case, the impurity concentration discontinuously changes at the interface between each of the regions adjacent to each other.

In the LDMOSFET of the second embodiment as constructed above, the impurity concentration Na of the low concentration region (212a) which locates just under the gate overhanging region (113) is set at a low value, and therefore, a depletion layer can be effectively spread in the low concentration region (212a) in the state of OFF in which the gate voltage is negative or has zero potential. By doing so, it becomes possible to increase the width of the depletion layer in the n-type drift region (212) in the state of OFF, so that the capacitance between the source region and the drain region can be more decreased.

On the other hand, in the state of ON gate voltage (in this case, positive voltage) is applied to the gate electrode (109), carriers (electrons) are accumulated on the surface of the low concentration region (212a) by the potential of the gate electrode (109). Therefore, it is possible to increase the carrier concentration in the state of ON, in spite of the condition under which the impurity concentration of the low concentration region (212a) is set at a lower value.

The impurity concentration Nc of the high concentration region (212c) is set at a relatively high value, and therefore, the carrier concentration of the high concentration region (212c) naturally becomes higher, so that the on-state resistance can be decreased.

As described above, the n-type drift region (212) of the LDMOSFET of the second embodiment can operate in the same manner as the n-type drift region (112) of the first embodiment, so that the LDMOSFET of the second embodiment can provide the same effects as those provided by the LDMOSFET of the first embodiment.

(Process of Constructing LDMOSFET of Second Embodiment)

Next, the production process of the LDMOSFET of the second embodiment of the present invention is described with reference to FIGS. 9A to 9J.

Figure 9A:
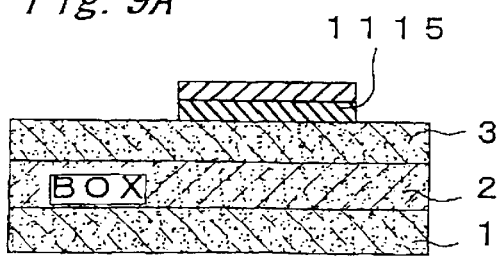
FIGS. 9A to 9J are sectional views, illustrating the steps of the production process of the second embodiment of the present invention.

First, an oxide layer is formed on the surface of a SOI substrate, and subjected to patterning to form an oxide layer (1115) (see FIG. 9A)

Figure 9F:
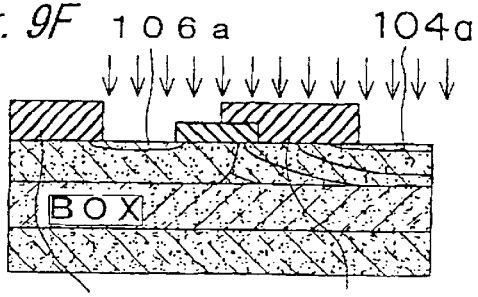
Figure 9B:
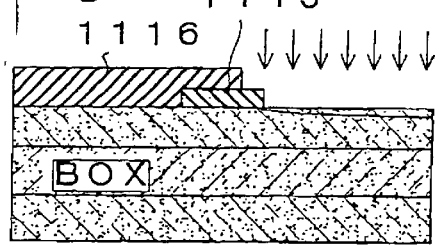

Next, the regions other than the regions for forming an $n^{++}$-type drain region (104) and an n-type drift region (212) are covered by a resist mask (1116), and a small dose of n-type impurity for forming a low concentration region (212a) is injected to the regions for $n^{++}$-type drain region and n-type drift region (see FIG. 9B). Then, the n-type impurity is diffused to a predetermined length by heating.

Figure 9G:
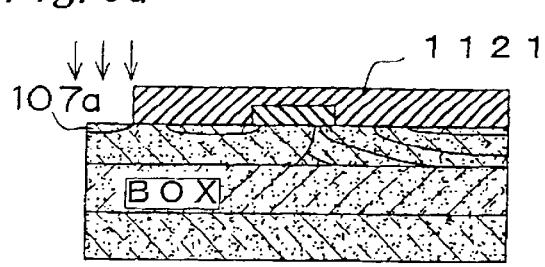
Figure 9C:
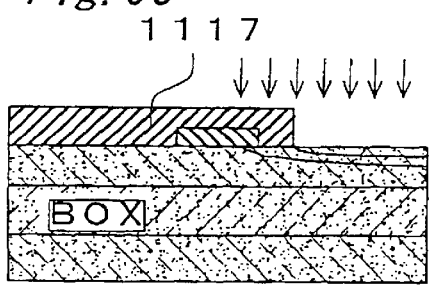

Next, a resist (1117) for covering up to a region for forming the low concentration region (212a) is formed, and a little larger dose of n-type impurity for forming a medium concentration region (212b) is injected (see FIG. 9C). Then, the n-type impurity is diffused to a predetermined length by heating.

Figure 9H:
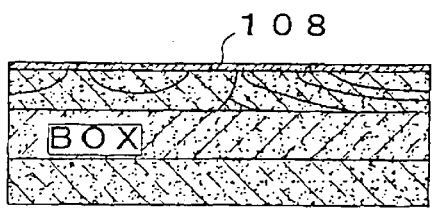
Figure 9D:
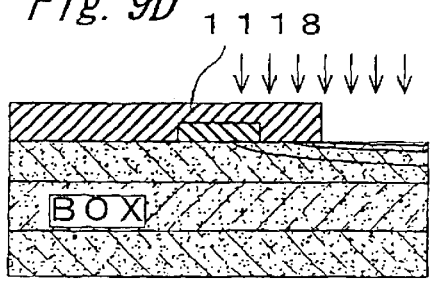

Next, a resist (1118) for covering up to a region for forming the medium concentration region (212b) is formed, and a large dose of n-type impurity for forming a high concentration region (212c) is injected (see FIG. 9D). Then, the n-type impurity is treated by heat and diffused to a predetermined length.

In this way, different doses of n-type impurities are injected and diffused by heating, separately in three stages, so that an n-type drift region (212) in which the impurity concentration changes stepwise between each of the respective regions is formed.

Figure 9I:
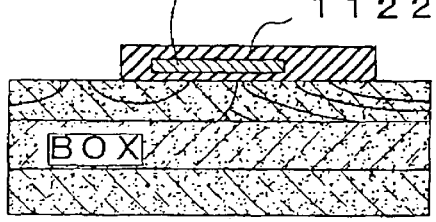
Figure 9E:
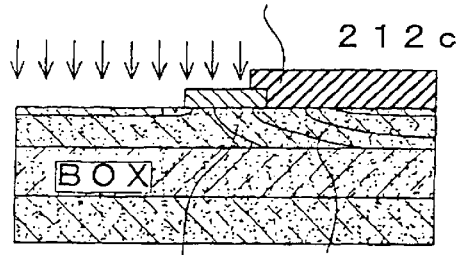
Figure 9J:
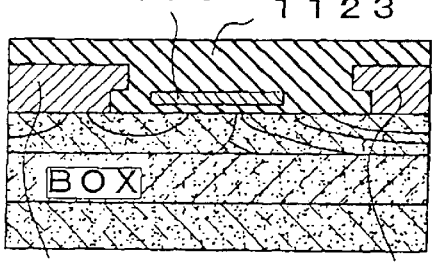
Figure 10A:
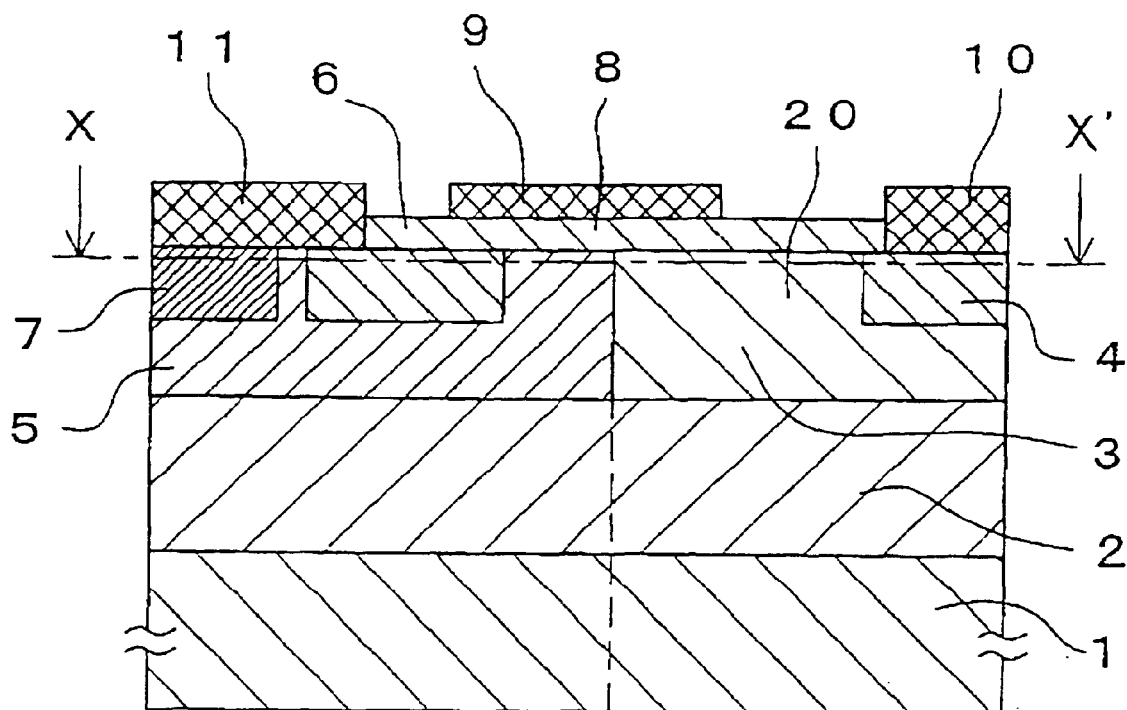
FIG. 10A is a sectional view of a LDMOSFET according to the prior art.
Figure 10B:
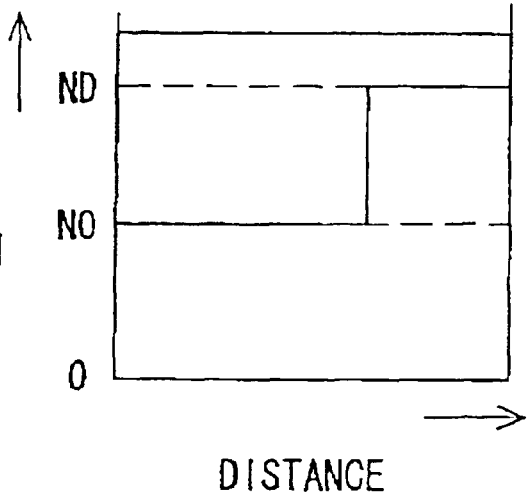
FIG. 10B is a graph showing the substantial impurity concentration distribution of the drift region in FIG. 10A.
Figure 11:
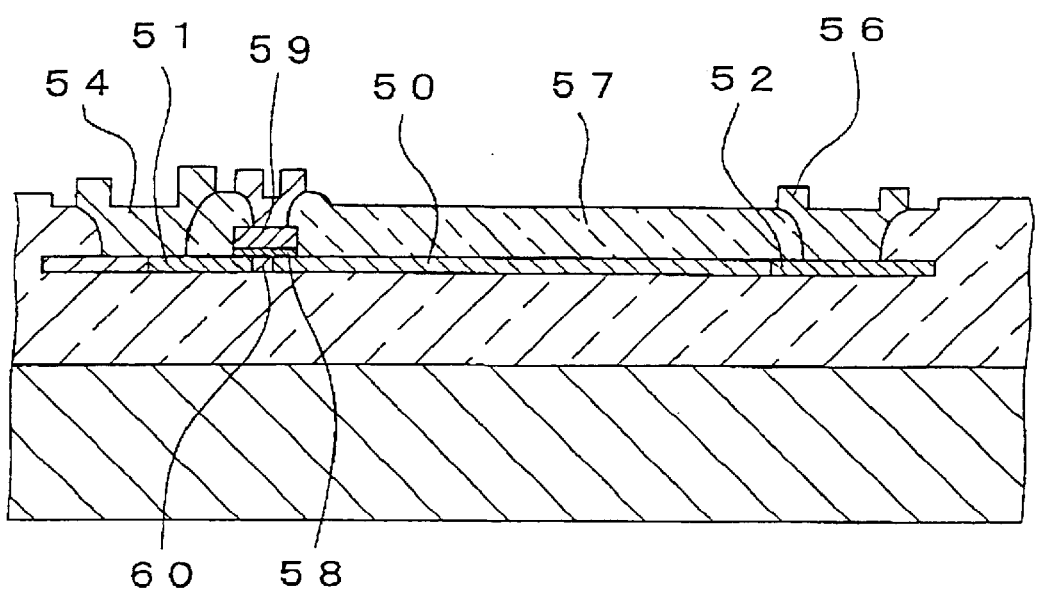
FIG. 11 is a sectional view of a LDMOSFET according to another prior art.
Figure 12:
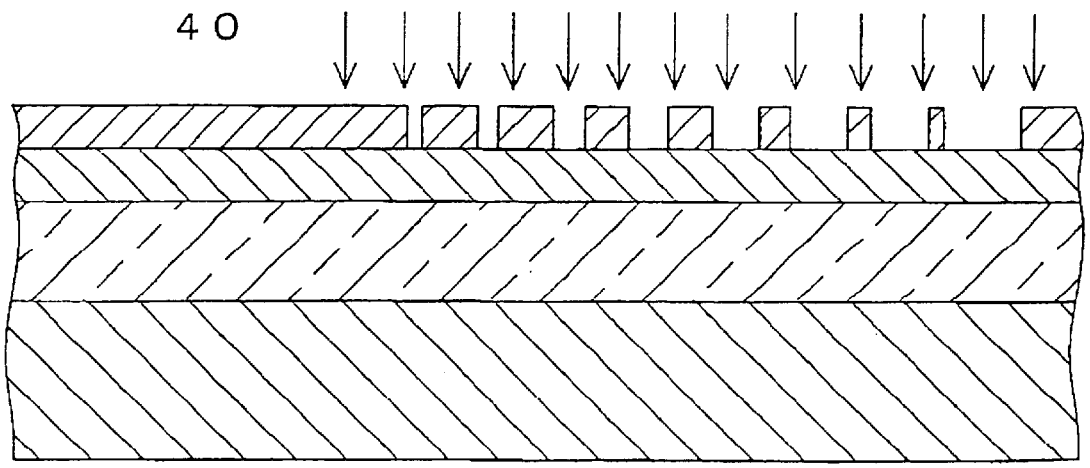
FIG. 12 is a sectional view of the LDMOSFET according to another prior art, illustrating one step of the production process of the LDMOSFET.

Next, as shown in FIG. 9E, an impurity for forming a $p^+$-type well region (105) is injected through the oxide layer mask (1115) and a resist mask (1119) and treated by heat, so that the $p^+$-type well region (105) which reaches up to the insulating layer (2) is formed.

Next, a resist mask (1120) for forming an $n^{++}$-type source region (106) and an $n^{++}$-type drain region (104) is formed, and an n-type impurity is injected through the resist mask (1120) and the silicon oxide layer (1115) as the mask so as to form n-type impurity-implanted regions (104a) and (106a) (see FIG. 9F).

Next, the resist mask (1120) is removed, and then, a resist mask (1121) for forming a $p^{++}$-type base contact region is formed, and a p-type impurity is injected through the resist mask (1121) to form a p-type impurity-implanted region (107a) (see FIG. 9G).

The resist mask (1121) is removed, and a heat treatment is carried out to diffuse the respective impurities in the n-type impurity-implanted regions (104a) and (106a) and the p-type impurity-implanted region (107a), so that the $n^{++}$-type drain region (104), the $n^{++}$-type source region (106) and the $p^{++}$-type base contact region (107) are formed, respectively.

Then, a silicon oxide layer (108) for a gate oxide layer is formed (see FIG. 9H).

Next, a gate electrode (109) is formed on the silicon oxide layer (108), and an intermediate layer (1122) is further formed, and a part of the intermediate layer (1122) for forming drain, source and base contact regions is removed by etching (see FIG. 9I).

Then, a drain electrode (110) and a source electrode (111) are formed, and finally, a protective layer (1123) is formed to thereby complete the LDMOSFET according to the second embodiment.

According to the production process of the LDMOSFET (1100) of the second embodiment, the impurity concentration distribution of the n-type drift region (212) can be formed, spending a relatively short time in diffusing the impurities, in case where the n-type semiconductor layer (3) is thin and the drift length is relatively long.

It is further understood by those skilled in the art that the foregoing descriptions are the preferred embodiments of the disclosed device and that various changes and modifications may be made in the invention without departing from the spirit and scope thereof.

What is claimed is:

1. A semiconductor device comprising a semiconductor layer formed on a semiconductor substrate, said semiconductor layer including
   a first conductivity type-drain region formed in a part of the semiconductor layer,
   a second conductivity type-well region formed in a part of the semiconductor layer and apart from the drain region,
   a first conductivity type-source region formed in the well region,
   a first conductivity type-drift region formed between one end of the well region and the drain region and in contact with both the well region and drain region, the impurity concentration of said drift region monotonically drecreasing both in the lateral direction and in the vertical direction as the distance from the drain region increases, the lateral direction being parallel to the surface of the semiconductor layer, the vertical direction being perpendicular to the surface of the semiconductor layer,
   a gate oxide layer formed on the well region located between the drift region and the source region, and
   a gate electrode formed on the gate oxide layer.

2. The semiconductor device according to claim 1, wherein the semiconductor layer is formed on an insulating layer on the semiconductor substrate.

3. The semiconductor device according to claim 1, wherein the impurity concentration in the lateral direction of the drift region changes obeying the Gaussian distribution having, as a parameter, the distance x from the drain region in the lateral direction, and the impurity concentration in the vertical direction of the drift region changes obeying the Gaussian distribution having, as a parameter, the distance y from the drain region in the vertical direction.

4. The semiconductor device according to claim 1, wherein the gate electrode is formed so as to overhang the drift region for covering a part of the drift region, and the impurity concentration of said part of the drift region locating just under the gate electrode is lower than the impurity concentration N(RESURF) which satisfies the RESURF condition.

5. The semiconductor device according to claim 1, wherein the impurity concentration of a part of the drift region in the vicinity of the drain region is higher than the impurity concentration N(RESURF) which satisfies the RESURF condition.

6. The semiconductor device according to claim 1, wherein, a thickness t of the semiconductor layer is set within a range of 0.3 $\mu m \leq t \leq 15$ $\mu m$.

7. The semiconductor device according to claim 1, wherein, a thickness t of the semiconductor layer is set within a range of 0.5 $\mu m \leq t \leq 4$ $\mu m$.

8. The semiconductor device according to claim 1, wherein, a thickness t of the semiconductor layer is set within a range of 0.5 $\mu m \leq t \leq 1.5$ $\mu m$.

9. The semiconductor device according to claim 1, wherein the distance of the drift region from one end of the drain region to one end of the well region is set 15 $\mu m$ or less.

* * * * *